(12) United States Patent
Chandrasekharan et al.

(10) Patent No.: US 10,781,516 B2
(45) Date of Patent: Sep. 22, 2020

(54) CHEMICAL DEPOSITION CHAMBER HAVING GAS SEAL

(71) Applicant: LAM RESEARCH CORPORATION, Fremont, CA (US)

(72) Inventors: Ramesh Chandrasekharan, Portland, OR (US); Jeremy Tucker, Mountainview, CA (US); Saangrut Sangplung, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 682 days.

(21) Appl. No.: 15/385,089

(22) Filed: Dec. 20, 2016

(65) Prior Publication Data

US 2017/0101710 A1    Apr. 13, 2017

(51) Int. Cl.
    *C23C 16/44*     (2006.01)
    *C23C 16/455*    (2006.01)
    *H01L 21/67*     (2006.01)

(52) U.S. Cl.
    CPC ...... *C23C 16/4409* (2013.01); *C23C 16/4408* (2013.01); *C23C 16/4412* (2013.01);
    (Continued)

(58) Field of Classification Search
    CPC .......... C23C 16/4409; C23C 16/45519; C23C 16/45544; C23C 16/45565;
    (Continued)

(56) References Cited

U.S. PATENT DOCUMENTS

| 5,614,026 A | 3/1997 | Williams |
| 7,699,932 B2 | 4/2010 | Miller et al. |

(Continued)

FOREIGN PATENT DOCUMENTS

| CN | 101171365 A | 4/2008 |
| CN | 102762767 A | 10/2012 |

OTHER PUBLICATIONS

Office Action with English translation dated Aug. 25, 2017 in corresponding Chinese Patent Application No. 2014-10307452.4, 17 pages.
(Continued)

*Primary Examiner* — Kambiz Zand
*Assistant Examiner* — Mirza Israr Javed
(74) *Attorney, Agent, or Firm* — Schwegman Lundberg & Woessner, P.A.

(57) ABSTRACT

A chemical deposition apparatus having a chemical deposition chamber formed within the chemical isolation chamber includes a gas seal. The chemical deposition chamber includes a showerhead module having a faceplate with gas inlets to deliver reactor chemistries to a wafer cavity for processing a semiconductor substrate. The showerhead module includes primary exhaust gas outlets to remove reaction gas chemistries and inert gases from the wafer cavity. An inert gas feed delivers seal gas which flows radially inwardly at least partly through a gap between a step of the showerhead module and the pedestal module to form a gas seal. Secondary exhaust gas outlets withdraw at least some of the inert gas flowing through the gap to provide a high Peclet number.

14 Claims, 11 Drawing Sheets

(52) U.S. Cl.
CPC .. *C23C 16/45519* (2013.01); *C23C 16/45544* (2013.01); *C23C 16/45565* (2013.01); *H01L 21/67017* (2013.01); *H01L 21/6719* (2013.01); *H01L 21/67126* (2013.01)

(58) Field of Classification Search
CPC ............ C23C 16/4412; C23C 16/4408; C23C 14/564; C23C 16/4401; H01L 21/67126; H01L 21/67017; H01L 21/6719; H01L 21/67; H01L 21/6736; H01J 37/32513; H01J 37/32871; H01J 37/32682
See application file for complete search history.

(56) References Cited

U.S. PATENT DOCUMENTS

| | | | |
|---|---|---|---|
| 7,993,457 B1 | 8/2011 | Krotov et al. | |
| 8,282,735 B2* | 10/2012 | Choi | C23C 16/45504 118/715 |
| 8,282,983 B1 | 10/2012 | Kapoor et al. | |
| 2002/0076490 A1 | 6/2002 | Chiang et al. | |
| 2004/0231799 A1* | 11/2004 | Lee | C23C 16/45544 156/345.34 |
| 2006/0137608 A1* | 6/2006 | Choi | C23C 16/515 118/715 |
| 2006/0249077 A1* | 11/2006 | Kim | C23C 16/4412 118/723 MP |
| 2007/0026540 A1* | 2/2007 | Nooten | H01L 29/66181 438/5 |
| 2007/0031600 A1* | 2/2007 | Devitt | B05C 13/00 427/248.1 |
| 2007/0221129 A1* | 9/2007 | Bae | C23C 16/45565 118/715 |
| 2007/0256786 A1* | 11/2007 | Zhou | H01L 21/02002 156/345.34 |
| 2009/0156015 A1* | 6/2009 | Park | C23C 16/40 438/758 |
| 2011/0017139 A1 | 1/2011 | Chiang et al. | |
| 2011/0111136 A1 | 5/2011 | Slevin et al. | |
| 2011/0256645 A1* | 10/2011 | Tam | B05B 1/18 438/14 |
| 2011/0256724 A1 | 10/2011 | Chandrasekharan et al. | |
| 2012/0231628 A1 | 9/2012 | Lee | |
| 2013/0040460 A1 | 2/2013 | Yoon et al. | |
| 2015/0004798 A1* | 1/2015 | Chandrasekharan | H01L 21/67017 438/758 |
| 2015/0007770 A1* | 1/2015 | Chandrasekharan | C23C 16/45572 118/715 |

OTHER PUBLICATIONS

Office Action with partial English translation dated Feb. 2, 2018 in corresponding Chinese Patent Application No. 2014-10307452.4, 8 pages.
Final Office Action with partial English translation dated Jun. 25, 2018 in corresponding Chinese Patent Application No. 2014-10307452.4, 9 pages.

* cited by examiner

US 10,781,516 B2

CHEMICAL DEPOSITION CHAMBER HAVING GAS SEAL

FIELD OF THE INVENTION

This invention pertains to apparatuses and processes for conducting chemical depositions and for use in conducting plasma enhanced chemical depositions.

BACKGROUND

Plasma processing apparatuses can be used to process semiconductor substrates by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), plasma enhanced pulsed deposition layer (PEPDL) processing, and resist removal. For example, one type of plasma processing apparatus used in plasma processing includes a reaction or deposition chamber containing top and bottom electrodes. A radio frequency (RF) power is applied between the electrodes to excite a process gas into a plasma for processing semiconductor substrates in the reaction chamber.

SUMMARY

According to an embodiment, a chemical deposition chamber having a gas seal comprises a showerhead module and a pedestal module configured to support a semiconductor substrate in a wafer cavity beneath the faceplate. The faceplate includes a plurality of gas inlets configured to deliver process gas to the wafer cavity. The showerhead module includes primary exhaust gas outlets configured to remove reaction gas chemistries and inert gases from the wafer cavity. The showerhead module includes a step at an outer periphery of the wafer cavity and an inert gas feed configured to deliver an inert gas to form a gas seal in a gap between the step and the pedestal module. The showerhead module includes secondary exhaust gas outlets located radially outward of the main exhaust gas outlets, the secondary exhaust gas outlets configured to remove at least some of the inert gas which flows radially inward through the gap.

According to another embodiment, a method for containing reaction gas chemistries from escaping from the wafer cavity of the chemical deposition chamber described above includes the following steps: (a) supporting a semiconductor substrate on the pedestal module, (b) flowing process gas through the gas inlets of the faceplate, (c) withdrawing gases from the wafer cavity via the primary exhaust gas outlets, (d) maintaining a gas seal in the gap between the step and the pedestal module by flowing inert gas through the inert gas feed, and (e) withdrawing at least some of the inert gas flowing radially inward through the gap via the secondary exhaust gas outlets.

BRIEF DESCRIPTION OF THE DRAWING FIGURES

DETAILED DESCRIPTION

Figure 1A:
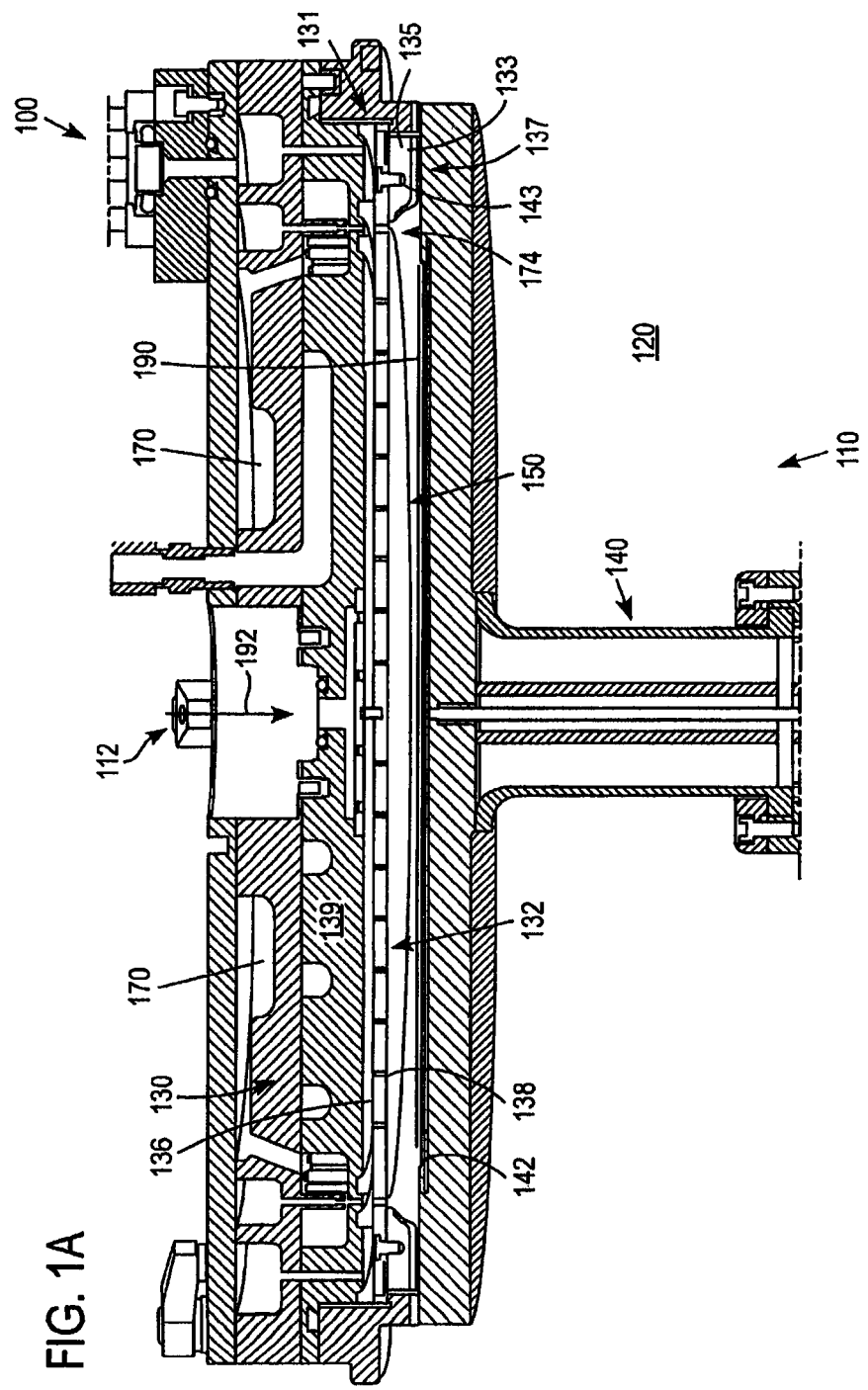
FIG. 1A is a schematic diagram showing a chemical deposition apparatus with a pedestal in accordance with an exemplary embodiment.

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein.

In accordance with an exemplary embodiment, the apparatuses and associated methods disclosed herein can be used for a chemical deposition such as a plasma enhanced chemical deposition. The apparatus and methods can be used in conjunction with a semiconductor fabrication based dielectric deposition process that requires separation of self-limiting deposition steps in a multi-step deposition process (for example, atomic layer deposition (ALD), plasma enhanced atomic layer deposition (PEALD), pulsed deposition layer (PDL), or plasma enhanced pulsed deposition layer (PEPDL) processing), however they are not so limited.

As indicated, present embodiments provide apparatus and associated methods for conducting a chemical deposition such as a plasma enhanced chemical vapor deposition. The apparatus and methods are particularly applicable for use in conjunction with semiconductor fabrication based dielectric deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), or plasma enhanced pulsed deposition layer (PEPDL) processing), however they are not so limited.

The aforementioned processes can suffer from some drawbacks associated with nonuniform temperatures across a wafer or substrate receiving deposited material. For example, nonuniform temperatures may develop across a substrate when a passively heated showerhead, which is in thermal contact with surrounding chamber components, loses heat to the surrounding components. Therefore, the showerhead which forms an upper wall of a processing zone is preferably thermally isolated from the surrounding components such that an isothermal processing zone may be formed, thereby forming uniform temperatures across the substrate. The uniform temperatures across the substrate aid in the uniform processing of substrates wherein the substrate temperature provides activation energy for the deposition process and is therefore a control means for driving the deposition reaction.

Further, there are generally two main types of deposition showerheads, the chandelier type and the flush mount. The chandelier showerheads have a stem attached to the top of the chamber on one end and the faceplate on the other end, resembling a chandelier. A part of the stem may protrude the chamber top to enable connection of gas lines and RF power. The flush mount showerheads are integrated into the top of a chamber and do not have a stem. Present embodiments pertain to a flush mount type showerhead wherein the flush mount showerhead reduces chamber volume, which must be evacuated by a vacuum source during processing.

Figure 1B:
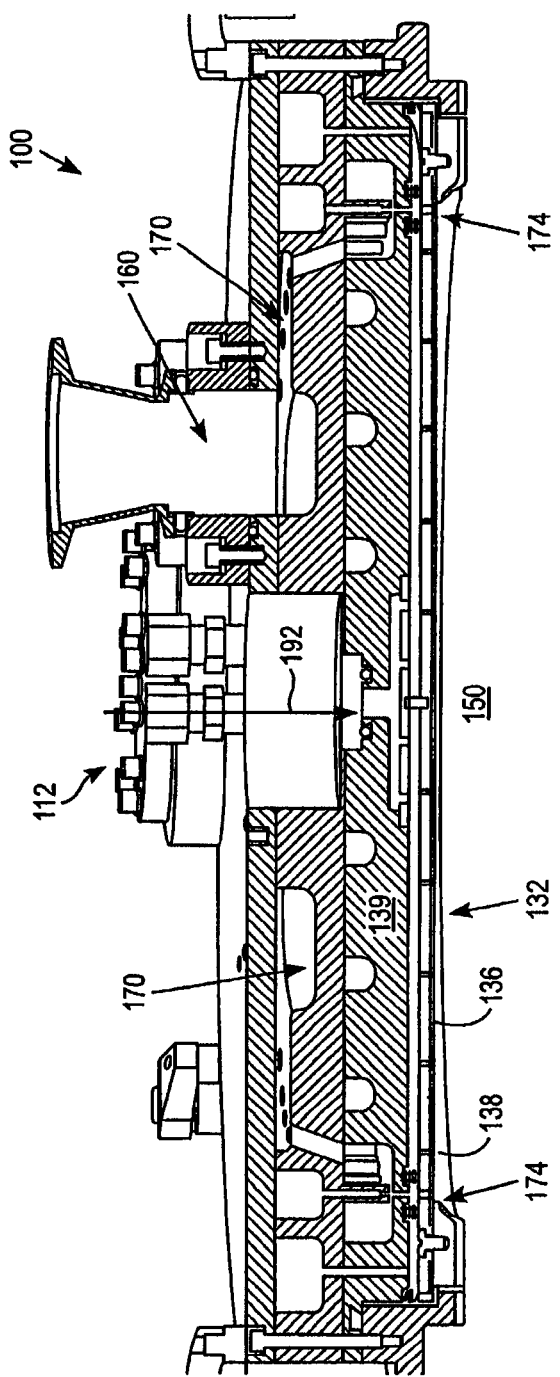
FIG. 1B is a schematic diagram showing a chemical deposition apparatus without a pedestal in accordance with an exemplary embodiment.

FIGS. 1A and 1B are schematic diagrams showing a chemical deposition apparatus 100 in accordance with embodiments disclosed herein. As shown in FIGS. 1A and 1B, the chemical apparatus includes a chemical isolation chamber or housing 110, a deposition chamber 120, a showerhead module 130, and a moving pedestal module 140 that can be vertically raised or lowered relative to the showerhead module 130 to raise and lower a substrate (or wafer) 190 position on an upper surface of the pedestal module 140. The showerhead module 130 can also be vertically raised and lowered. Reactant material gases (or process gases) 192 (FIG. 3) are introduced into the subchamber (or wafer cavity) 150 via gas lines 112 through a central plenum 202 (FIG. 6) of the showerhead module 130. Each of the gas lines 112 may have a corresponding accumulator (not shown), which can be isolated from the apparatus 100 using isolation valves (not shown). In accordance with an exemplary embodiment, the apparatus 100 can be modified to have one or more gas lines 112 with isolation valves and accumulators, depending on the number of reactant gases used. Also, reactant gas delivery lines 112 can be shared between a plurality of chemical deposition apparatuses or multi-station system.

In accordance with an exemplary embodiment, the chamber 120 can be evacuated through one or more vacuum lines 160 (FIG. 2) that are connected to a vacuum source (not shown). For example, the vacuum source can be a vacuum pump (not shown). In multi-station reactors, for example, those having multiple stations or apparatuses 100 that perform the same deposition process, a vacuum line 160 from another station may share a common foreline with the vacuum line 160. In addition, the apparatus 100 can be modified to have one or more vacuum lines 160 per station or apparatus 100.

In accordance with an exemplary embodiment, a plurality of evacuation conduits 170 can be configured to be in fluid communication with one or more exhaust outlets 174 within the faceplate 136 of the showerhead module 130. The exhaust outlets 174 can be configured to remove process gases or reactor chemistries 192 from the wafer cavity 150 between deposition processes. The plurality of evacuation conduits 170 are also in fluid communication with the one or more vacuum lines 160. The evacuation conduits 170 can be spaced circumferentially around the substrate 190 and may be evenly spaced. In some instances, the spacing of plurality of conduits 170 may be designed to compensate for the locations of the vacuum lines 160. Because there are generally fewer vacuum lines 160 than there are plurality of conduits 170, the flow through the conduit 170 nearest to a vacuum line 160 may be higher than one further away. To ensure a smooth flow pattern, the conduits 170 may be spaced closer together if they are further away from the vacuum lines 160. An exemplary embodiment of a chemical deposition apparatus 100 including a plurality of conduits 170 including a variable flow conductor can be found in commonly-assigned U.S. Pat. No. 7,993,457, which is hereby incorporated by reference in its entirety.

Embodiments disclosed herein are preferably implemented in a plasma enhanced chemical deposition apparatus (e.g., PECVD apparatus, PEALD apparatus, or PEPDL apparatus). Such an apparatus may take different forms wherein the apparatus can include one or more chambers or "reactors" 110, which can include multiple stations or deposition chambers 120 as described above, that house one or more substrates 190 and are suitable for substrate processing. Each chamber 120 may house one or more substrates for processing. The one or more chambers 120 maintain the substrate 190 in a defined position or positions (with or without motion within that position, e.g. rotation, vibration, or other agitation). In one embodiment, a substrate 190 undergoing deposition and treatment can be transferred from one station (e.g. deposition chamber 120) to another within the apparatus 100 during the process. While in process, each substrate 190 is held in place by a pedestal, wafer chuck and/or other wafer holding apparatus of the pedestal module 140. For certain operations in which the substrate 190 is to be heated, the pedestal module 140 may include a heater such as a heating plate.

Figure 2:
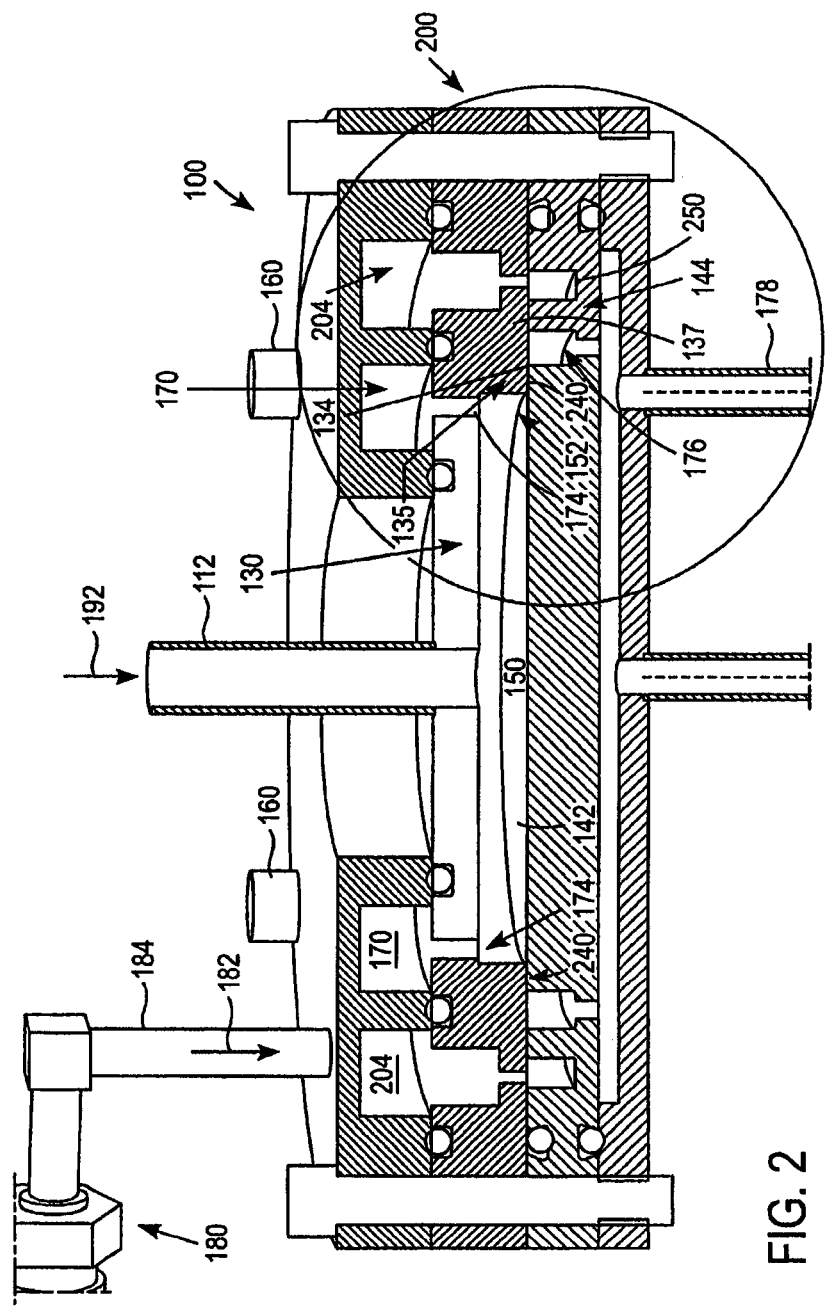
FIG. 2 is a cross-sectional view of a gas based sealing system in accordance with an exemplary embodiment.

FIG. 2 is a cross-sectional view of a chemical deposition apparatus 100 having a gas based sealing system 200 in accordance with an exemplary embodiment. As shown in FIG. 2, the chemical deposition apparatus 100 includes a substrate pedestal module 140, which is configured to receive and/or discharge a semiconductor substrate (or wafer) 190 from an upper surface 142 of the pedestal module 140. In a lower position, a substrate 190 is placed on the surface 142 of the pedestal module 140, which is then raised vertically upward towards the showerhead module 130. In accordance with an exemplary embodiment, the distance between the upper surface 142 of the pedestal module 140 and a lower surface 132 of the showerhead module 130, which forms a wafer cavity 150 can be about 0.2 inches (5 millimeters) to about 0.6 inches (15 millimeters). The upward vertical movement of the pedestal module 140 to close the wafer cavity 150 creates a narrow gap 240 between the pedestal module 140 and a step 135 around an outer portion 131 of the faceplate 136 (FIGS. 1A and 1B) of the showerhead module 130.

In an exemplary embodiment, the temperature inside the chamber 120 can be maintained through a heating mechanism in the showerhead module 130 and/or the pedestal module 140. For example, the substrate 190 can be located in an isothermal environment wherein the showerhead module 130 and the pedestal module 140 are configured to maintain the substrate 190 at a desired temperature. In an exemplary embodiment, the showerhead module 130 can be heated to greater than 250° C., and/or the pedestal module 140 can be heated in the 50° C. to 550° C. range. The deposition chamber or cavity 150 serves to contain the plasma generated by a capacitively coupled plasma type system including the showerhead module 130 working in conjunction with the pedestal module 140.

RF source(s) (not shown), such as a high-frequency (HF) RF generator, connected to a matching network (not shown), and a low-frequency (LF) RF generator are connected to showerhead module 130. The power and frequency supplied by matching network is sufficient to generate a plasma from the process gas/vapor. In an embodiment, both the HF generator and the LF generator can be used. In a typical process, the HF generator is operated generally at frequencies of about 2-100 MHz; in a preferred embodiment at 13.56 MHz. The LF generator is operated generally at about 50 kHz to 2 MHz; in a preferred embodiment at about 350 to 600 kHz. The process parameters may be scaled based on the chamber volume, substrate size, and other factors. For example, power outputs of LF and HF generators are typically directly proportional to the deposition surface area of the substrate. The power used on 300 mm wafers will generally be at least 2.25 higher than the power used for 200 mm wafers. Similarly, the flow rates, such as standard vapor pressure, for example, can depend on the free volume of the deposition chamber 120.

Within the deposition chamber 120, the pedestal module 140 supports the substrate 190 on which materials may be deposited. The pedestal module 140 typically includes a chuck, a fork, or lift pins to hold and transfer the substrate during and between the deposition and/or plasma treatment reactions. The pedestal module 140 may include an electrostatic chuck, a mechanical chuck, or various other types of chuck as are available for use in the industry and/or research. The pedestal module 140 can be coupled with a heater block for heating the substrate 190 to a desired temperature. Generally, the substrate 190 is maintained at a temperature of about 25° C. to 500° C. depending on the material to be deposited.

In accordance with an exemplary embodiment, the gas based sealing system 200 can be configured to help control and regulate flow out from the wafer cavity 150 during flow of process material or purge gas. In accordance with an exemplary embodiment, the evacuation or purging of the wafer cavity 150 uses an inert or purge gas (not shown), which is fed into the wafer cavity 150 through the showerhead module 130. In accordance with an exemplary embodiment, one or more conduits 170 can be connected to the vacuum lines 160 via an annular evacuation passage 176, which is configured to remove inert seal gas 182 (FIG. 2) from a zone below the pedestal module 140.

In accordance with an exemplary embodiment, the showerhead module 130 is configured to deliver reactor chemistries to the wafer cavity (or reaction chamber) 150. The showerhead module 130 can include a faceplate 136 having a plurality of inlets or through holes 138 and a backing plate 139. In accordance with an exemplary embodiment, the faceplate 136 can be a single plate having a plurality of inlets or through holes 138 and the step 135, which extends around the outer periphery 137 of the faceplate 136. Alternatively, the step 135 can be a separate ring 133, which is secured to a lower surface of the outer portion 131 of the faceplate 136. For example, the step 135 can be secured to the outer portion 131 of the faceplate 136 with screws 143. An exemplary embodiment of a showerhead module 130 for distribution of process gases including a faceplate 136 having concentric exhaust outlets 174 can be found in commonly-assigned U.S. Pat. No. 5,614,026, which is hereby incorporated by reference in its entirety. For example, in accordance with an exemplary embodiment, the exhaust outlets 174 surround the plurality of inlets 138.

In accordance with an exemplary embodiment, the wafer cavity 150 is formed beneath the lower surface 132 of the faceplate 136 of the showerhead module 130 and the upper surface 142 of the substrate pedestal module 140. The plurality of concentric evacuation conduits or exhaust outlets 174 within the faceplate 136 of the showerhead module 130 can be fluidly connected to the one or more of the plurality of conduits 170 to remove process gases or reactor chemistries 192 from the wafer cavity 150 between deposition processes.

Figure 3:
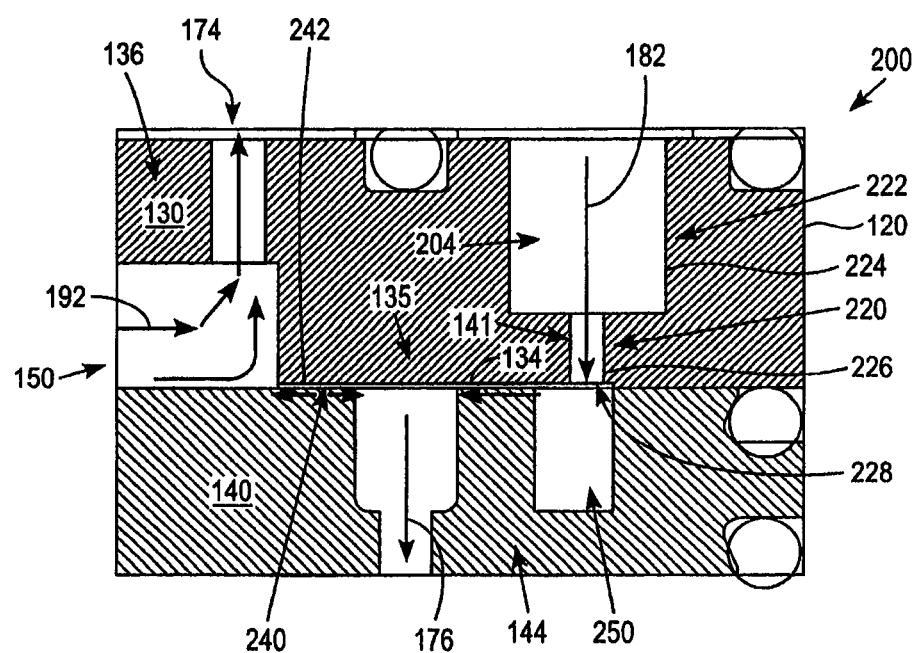
FIG. 3 is a cross-sectional view of a gas based sealing system in accordance with an exemplary embodiment.
Figure 4:
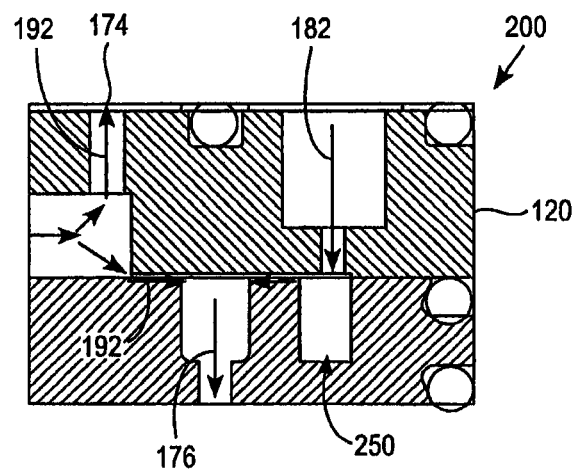
FIG. 4 is a cross-sectional view of a gas based sealing system in accordance with an exemplary embodiment.
Figure 5:
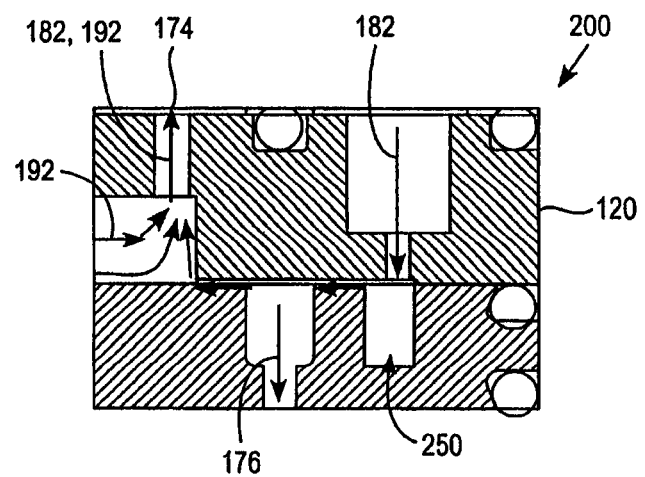
FIG. 5 is a cross-sectional view of a gas based sealing system in accordance with an exemplary embodiment.
Figure 6:
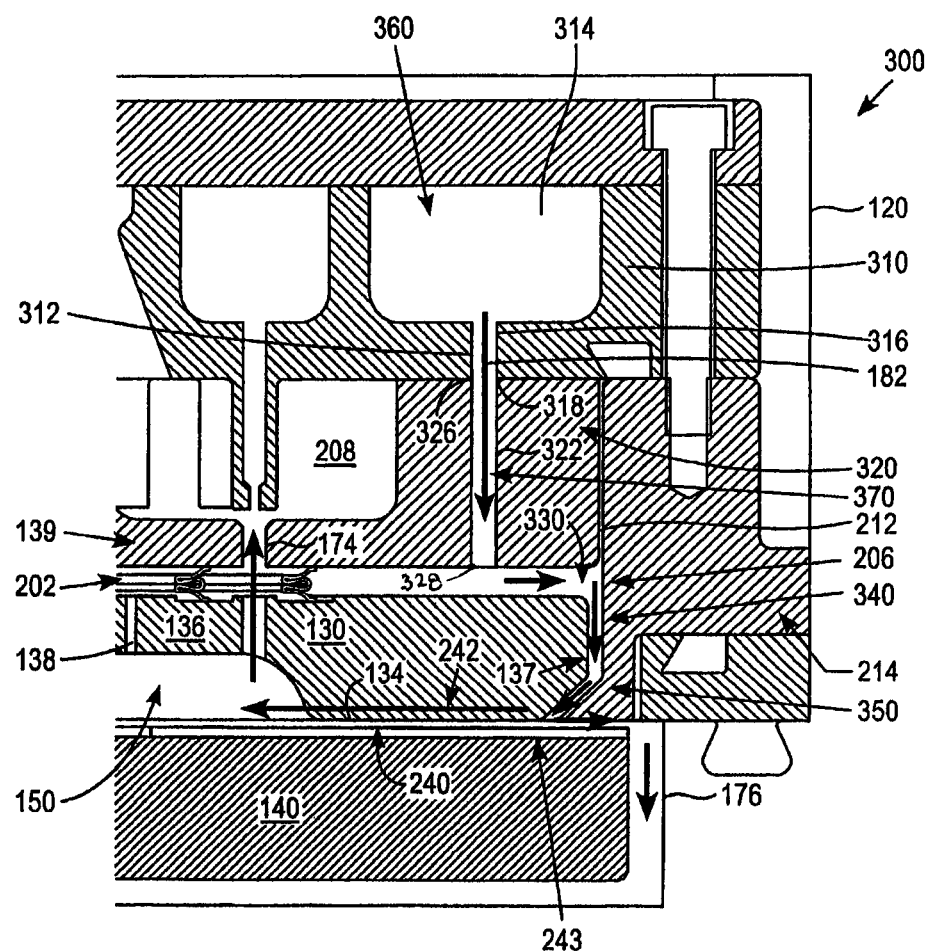
FIG. 6 is a cross-sectional view of a gas based sealing system in accordance with an exemplary embodiment.

As shown in FIG. 2, the apparatus 100 also includes a source 180 of inert gas or seal gas 182, which is fed through the one or more conduits 184 to an outer plenum 204 of the gas based sealing system 200. In accordance with an exemplary embodiment, the inert or seal gas 182 can be a nitrogen gas or argon gas. In accordance with an exemplary embodiment, the inert gas source 180 is configured to feed an inert seal gas 182 via one or more conduits 184 so as to flow radially inward through the narrow gap 240, which extends outward from the wafer cavity 150 and is formed between a lower surface 134 of a step 135 around the outer periphery 137 of the faceplate 136 and the upper surface 142 of the pedestal module 140. In accordance with an exemplary embodiment, the inert seal gas 182 communicates with process gases or reactor chemistries 192 (FIG. 3) from the wafer cavity 150 within the narrow gap 240 to form a gas seal during processing. As shown in FIGS. 3 and 4, the inert seal gas 182 only partly enters the narrow gap 240, which forms a gas seal between the reactor chemistries 192 and the inert gas 182 within the narrow gap. Alternatively, as shown in FIGS. 5 and 6, the flow of the inert gas 182 can be to an outer edge of the wafer cavity 150 and removed from the wafer cavity 150 through the one or more exhaust outlets 174 within the showerhead module 130.

In accordance with an exemplary embodiment, the annular evacuation passage 176 is fluidly connected to one or more of the plurality of evacuation conduits 170. In accordance with an exemplary embodiment, the annular evacuation passage 176 has one or more outlets (not shown) and is configured to remove the inert gases 182 from the zone surrounding the periphery of the substrate 190 and the inert gases 182 traveling or flowing radially inward through the narrow gap 240. The evacuation passage 176 is formed within an outer portion 144 of the substrate pedestal 140. The annular evacuation passage 176 can also be configured to remove the inert gases 182 from underneath the substrate pedestal 140. Further embodiments with multiple conduits similar to 176 can aid in withdrawing more inert gas 182 and enabling higher flow of inert gas into exhaust passages 178 and portion below the pedestal module 140. The exhaust passages 178 can also aid in creating a higher pressure drop on the seal gas and lower diffusion of the seal gas into the wafer cavity 150.

FIG. 3 is a cross-sectional view of a portion of a deposition chamber 120 of a chemical deposition apparatus 100 having a gas based sealing system 200 in accordance with an exemplary embodiment. As shown in FIG. 3, the outer plenum 204 can be formed in the outer portion 131 of the faceplate 136. The outer plenum 204 can include one or more conduits 220, which are configured to receive the inert gas 182 from the inert gas source 180. The inert gas 182 flows through the outer plenum 204 via the one or more conduits 220 to a lower outlet 228. The lower outlet 228 is in fluid communication with the narrow gap 240. In accordance with an exemplary embodiment, a distance from an outer edge 152 of the wafer cavity 150 to the outer periphery 141 of the faceplate 136 in communication with the outer plenum 204 is at a finitely controlled distance. For example, the distance (or width) from the outer edge 152 of the cavity 150 to the outer edge 141 of the faceplate 136 in communication with the outer plenum 204 can be from about 5.0 mm to 25.0 mm.

In accordance with an exemplary embodiment, the outer plenum 204 can be an outer annular recess 222. The outer annular recess 222 is configured to be in fluid communication with the narrow gap 240 on an outer edge of the wafer cavity 150 via the one or more conduits 220. The outer annular recess 222 can be configured to have an upper annular recess 224 and a lower annular recess 226, wherein the upper annular recess 224 has a greater width than the lower annular recess 226. In accordance with an exemplary embodiment, the lower outlet 228 is an annular outlet on a lower portion of the lower annular recess 226, which is in fluid communication with the narrow gap 240.

In accordance with an exemplary embodiment, as shown in FIG. 3, the inert gas 182 is fed through the outer plenum 204 at the outer edge of the wafer cavity 150 spaced at finitely controlled distances. The flow rate of the inert gas 182 flowing through the outer plenum 204 can be such that the Peclet number is greater than about 1.0, thus containing the reactor gas chemistries 192 within the wafer cavity 150, as shown in FIG. 3. For example, if the Peclet number is greater than 1.0, the inert gas 182 and the reactor gas chemistries 192 can establish an equilibrium within an inner portion 242 of the narrow gap 240. As a result, reactor gas chemistries 192 can be prevented from flowing beneath the substrate pedestal module 140 and contaminating portions of the deposition chamber 120 outside of the wafer cavity 150.

In accordance with an exemplary embodiment, if the process is a constant pressure process, then a single (or constant) flow of the inert gas 182 in combination with the pressure from below the pedestal module 140 can be sufficient to ensure an inert gas seal between the reactor gas chemistries 192 within the wafer cavity 150 and the inert gas 180 flowing radially inward through the narrow gap 240. For example, in accordance with an exemplary embodiment, the gas based sealing system 200, can be used with ALD oxides of Si, which can be generally run in a relatively constant pressure mode. In addition, the gas based sealing system 200 can act as a means to control gas sealing across different processes and pressure regimes within the deposition chamber 120 and the wafer cavity 150, for example, during an ALD nitride process by varying the flow rate of the inert gas 182 or pressure below the pedestal module 140 and/or a combination of both.

In accordance with an exemplary embodiment, the sealing gas system 200 as disclosed individually, or in combination with the pressures associated with the exhaust conduits 174, 176 can help prevent flow and/or diffusion of reactor chemistries 192 out of wafer cavity 150 during processing. In addition, the system 200 individually, or in combination with the exhaust conduits 174, 176 and pressure associated with the exhaust conduits 174, 176 can also prevent the bulk flow of the inert gas 182 into the wafer cavity 150 and over onto the substrate 190. The flow rate of the inert gas 182 into the narrow gap 240 to isolate the wafer cavity 150 can be adjusted based on the pressure produced by the exhaust outlets 174. In accordance with an exemplary embodiment, for example, the inert gas or seal gas 182 can be fed through the outer plenum 204 at a rate of about 100 cc/minute to about 5.0 standard liters per minute (slm), which can be used to isolate the wafer cavity 150.

In accordance with an exemplary embodiment, one or more evacuation cavities 250 can be located in an outer portion of the pedestal module 140, which surrounds the wafer cavity 150. The one or more evacuation cavities 250 can be in fluid communication with the narrow gap 240 and the lower outlet 228, which can add to the pressure drop from the wafer cavity 150 to the inert or gas feed 180. The one or more evacuation cavities 250 (or annular channel) can also provide an added control mechanism to enable gas sealing across various process and pressure regimes, for example, during ALD nitride processing. In accordance with an exemplary embodiment, the one or more evacuation cavities 250 can be equally spaced around the deposition chamber 120. In an exemplary embodiment, the one or more evacuation cavities 250 can be an annular channel, which is concentric and of larger width than the lower outlet 228.

FIG. 4 is a cross-sectional view of a portion of the deposition chamber 120 of a chemical deposition apparatus 100 with a gas based sealing system 200. As shown in FIG. 4, if the flow rate of the reactor chemistries 192 is greater than or about equal to the flow rate of the inert gas 182, the flow of the reactor chemistries 192 may extend outside of the wafer cavity 150, which may not be desirable.

As shown in FIG. 4, an annular evacuation passage 176 provides a secondary evacuation path in addition to the main evacuation path 174 in the faceplate 136. The annular evacuation passage 176 is configured to remove the inert gases 182 from underneath the substrate pedestal 140 and from a zone surrounding a periphery of the substrate 190. In accordance with an exemplary embodiment, the annular evacuation passage 176 has one or more outlets (not shown) and is configured to remove the inert gases 182 from the zone surrounding the periphery of the substrate 190 and the inert gases 182 flowing or diffusing radially inward through the narrow gap 240.

FIG. 5 is a cross-sectional view of a portion of the deposition chamber 120 of a chemical deposition apparatus 100 with a gas based sealing system 200 in accordance with an exemplary embodiment. The flow of inert gas 182 from outside the cavity 150 can be produced by reducing the flow rate of the reactor chemistries 192 and/or increasing the flow rate of the inert gas 182. In accordance with an exemplary embodiment, the inert gas 182 from the outer plenum 204 will flow into the wafer cavity 150 and can be removed through the one or more exhaust outlets 174 within the showerhead module 130.

FIG. 6 is a cross-sectional view of a portion of the deposition chamber 120 of a chemical deposition apparatus 100 with a gas based sealing system 300 in accordance with an exemplary embodiment. In accordance with an exemplary embodiment, a central plenum 202 of the showerhead module 130 includes the plurality of inlets or through-holes 138, which delivers the reactor chemistries 192 to the wafer cavity 150. The wafer cavity 150 also includes concentric conduits or exhaust outlets 174 which remove reactor chemistries 192 and inert gases 182 from the wafer cavity 150. The concentric conduits or exhaust outlets 174 can be in fluid communication with an intermediate plenum 208 between the backing plate 139 and an upper plate 310. The intermediate plenum 208 is in fluid communication with one or more of the plurality of evacuation conduits 170.

The showerhead module 130 can also include vertical gas passage 370, which is configured to deliver an inert gas 182 around the outer periphery 137 of the faceplate 136. In accordance with an exemplary embodiment, an outer plenum 206 can be formed between the outer periphery 137 of the faceplate 136 and an inner periphery or edge 212 of an isolation ring 214.

As shown in FIG. 6, the system 300 includes the vertical gas passage 370 formed within an inner channel 360 within the upper plate 310 and an outer portion 320 of the backing plate 139. The vertical gas passage 370 includes one or more conduits 312, 322, which are configured to receive the inert gas 182 from the inert gas source or feed 180. In accordance with an exemplary embodiment, the inert gas 182 flows through the upper plate 310 and the outer portion 320 of the backing plate 139 via the one or more conduits 312, 322 to one or more recesses and/or channels 330, 340, 350 to an outer edge of the wafer cavity 150.

In accordance with an exemplary embodiment, the one or more conduits 312 can include an upper annular recess 314 and a lower outer annular recess 316. In accordance with an exemplary embodiment, the upper recess 314 has a greater width than the lower recess 316. In addition, the one or more conduits 322 can be within the upper plate 310 and the outer portion 320 of the backing plate 139. The one or more conduits 322 can form an annular recess having an inlet 326 in fluid communication with an outlet 318 on the upper plate 310 and an outlet 328 in fluid communication with the narrow gap 240. In accordance with an exemplary embodiment, the outlet 328 within the outer portion 320 can be in fluid communication with one or more recesses and/or channels 330, 340, 350, which guides the flow of the inert gas 182 around an outer periphery of the faceplate 136 of the showerhead module 130 to an outer edge 243 of the narrow gap 240.

In accordance with an exemplary embodiment, the inert gas 182 is fed through the vertical gas passage 370 to the outer plenum 206, and radially inwardly at least partly through the narrow gap 240 towards the wafer cavity 150. The flow rate of the inert gas 182 flowing through the one or recesses and/or channels 330, 340, 350 can be such that the Peclet number is greater than 1.0, thus containing the reaction gas chemistries 192 within the wafer cavity 150. In accordance with an exemplary embodiment, if the Peclet number is greater than 1.0, the inert gas 182 and the reaction gas chemistries 192 establishes an equilibrium within the inner portion 242 of the narrow gap 240, which prevents the reaction gas chemistries 192 from flowing beneath the pedestal module 140 and contaminating portions of the deposition chamber 120 outside of the wafer cavity 150. In accordance with an exemplary embodiment, by containing the flow of the reaction gas chemistries 192 to the wafer cavity 150, the system 200 can reduce the usage of process gas 192. In addition, the system 200 can also reduce the fill time of the wafer cavity 150 with the process gas 192 during processing.

Figure 7:
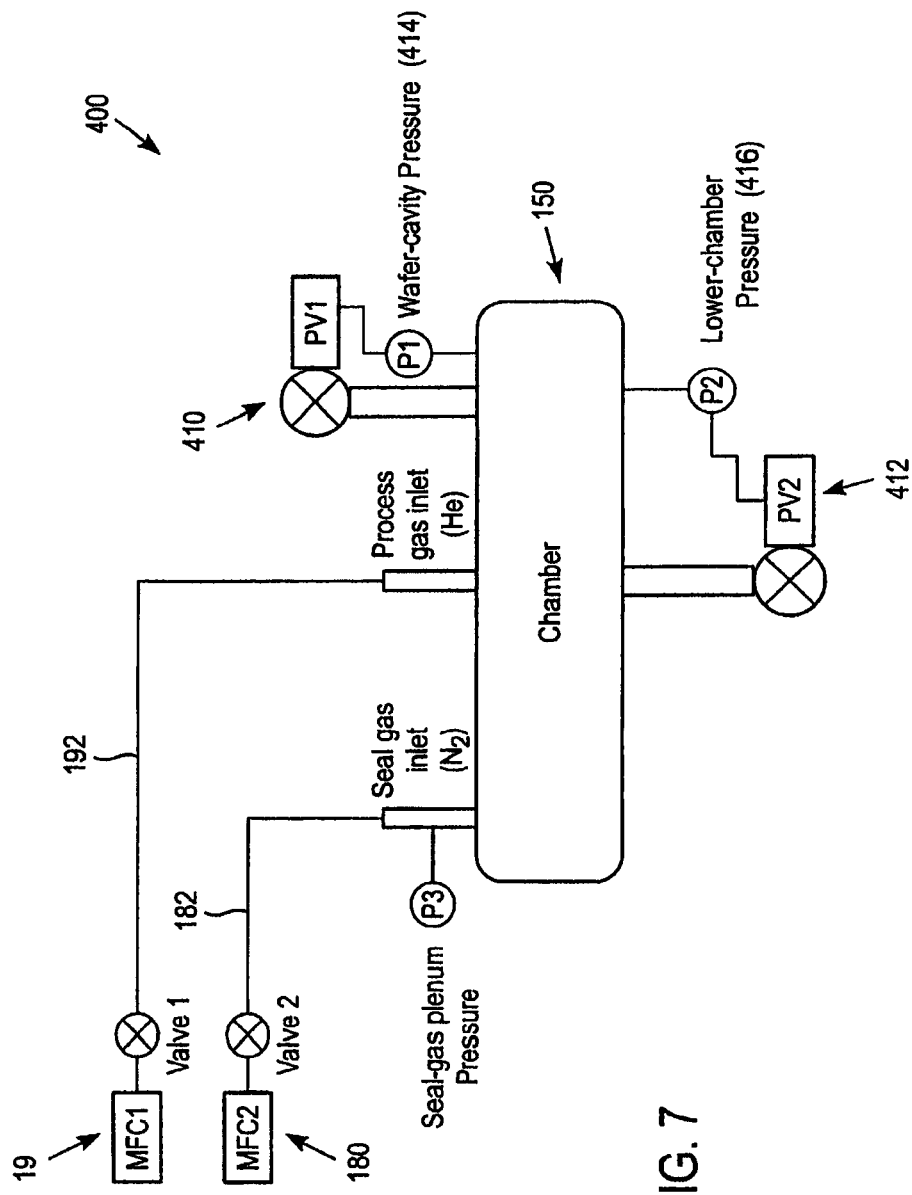
FIG. 7 is a schematic of a gas based sealing system in accordance with an exemplary embodiment.

FIG. 7 is a schematic of a gas based sealing system 400 in accordance with an exemplary embodiment. As shown in FIG. 7, the system 400 includes a source of an inert or seal gas 180 and source of a process gas 19, which are configured to deliver an inert or seal gas 182 and a process gas 192, respectively, to the wafer cavity 150. The system 400 can also include a wafer-cavity or cavity pressure valve 410 and a lower chamber pressure valve 412, which control a wafer-cavity or cavity pressure 414, and a lower chamber pressure 416, respectively.

Figure 8:
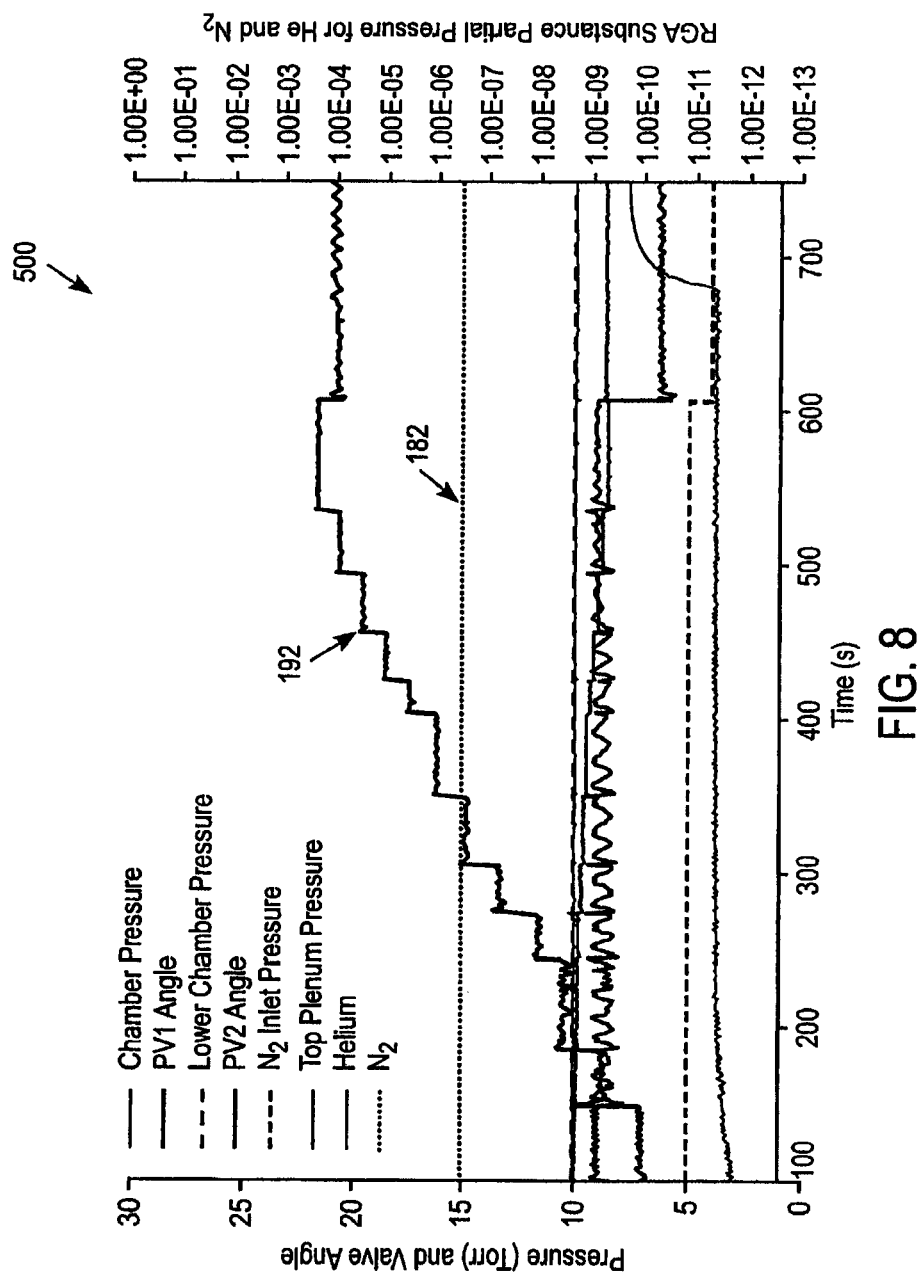
FIG. 8 is a chart showing pressure and valve angle versus time for a gas based sealing system in accordance with an exemplary embodiment.

FIG. 8 is a chart 500 showing pressure and valve angle versus time for a gas based sealing system 400 in accordance with an exemplary embodiment. In accordance with an exemplary embodiment, as shown in FIG. 8, a process gas 192 in the form of helium is supplied to the wafer cavity 150 at flow rates of 0 to about 20 SLM (standard liters per minute). An inert or seal gas 182 in the form of nitrogen gas ($N_2$) was provided to the cavity at about 2 SLM. In accordance with an exemplary embodiment, the cavity chamber 414 and the lower chamber pressure 416 was approximately 10 Torr. As shown in FIG. 8, at operating conditions of up to about 20 SLM of helium gas 192 and 2 SLM of nitrogen gas 182, the helium gas 192 did not leak through the purge channel as evidenced by the Residual Gas Analyzer (RGA) measurements.

Also disclosed herein is a method of processing a semiconductor substrate in a processing apparatus. The method comprises supplying process gas from the process gas source into the deposition chamber, and processing a semiconductor substrate in the plasma processing chamber. The method preferably comprises plasma processing the substrate wherein RF energy is applied to the process gas using an RF generator, which generates the plasma in the deposition chamber.

According to an embodiment, the Peclet number can be greater than 100 along an outer periphery of the semiconductor substrate. Preferably, precursor gases are injected centrally into the reactor cavity with minimum inlet volume and axisymmetric flow while seal gas is injected circumferentially around an outer periphery of the reactor cavity. The precursor gases are reacted to deposit a film on the semiconductor and byproduct gases flow radially outward towards exhaust outlets distributed circumferentially around an outer periphery of the reactor cavity. At the same time, the seal gas flows radially inward through inlets distributed circumferentially around the outer periphery of the reactor cavity. In order to obtain a high Peclet number, gas pressures are controlled according to the following equation:

$$C_2(P_{vs}-P_{wc})=\dot{m}_{wc}>>0->P_{vs}>>P_{wc}.$$

Figure 9:
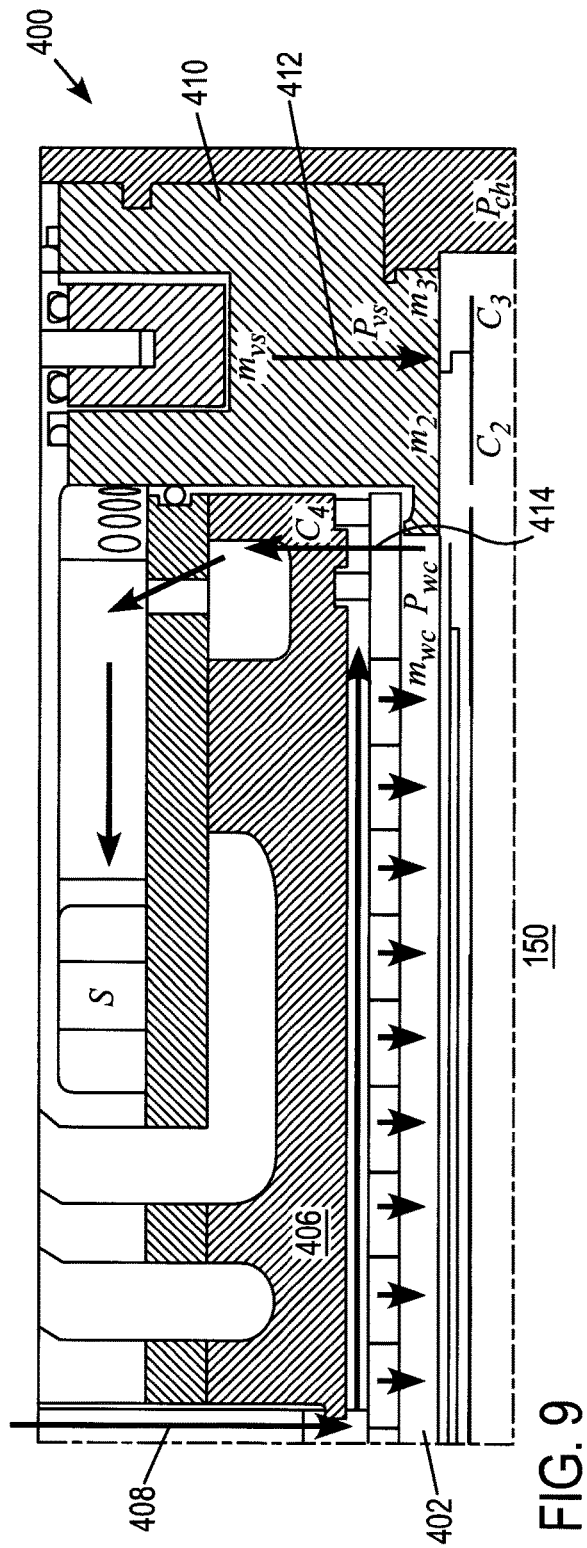
FIG. 9 illustrates gas flow in a showerhead module having a seal gas arrangement and main exhaust gas outlets around a periphery of the faceplate.

FIG. 9 illustrates an embodiment wherein a showerhead module 400 includes a faceplate 402 having gas outlets 404, a backing plate 406 having a central gas passage 408, and an isolation ring 410 having seal gas passages 412 distributed circumferentially around the reaction cavity so as to provide an inert gas seal with gas supplied through gas passages 412. Process gas is withdrawn via main exhaust passages 414 distributed circumferentially around an outer portion of the faceplate 402. In FIG. 9 and the following equation, $\dot{m}_2$ and $\dot{m}_{vs}$ represent mass flow rate in kg/s, $C_2$, $C_3$ and $C_4$ represent gas conductance in liters/second and $S_{eff}$ represents the effective pumping speed in liters/second. In order to obtain a high Peclet number it is desirable that $\dot{m}_{wc}$ should not be so large that it overwhelms the effective pumping speed, $\dot{m}_{vs}$ should be large, $C_2$ should be larger than $C_3$, $S_{eff}$ should be large and $P_{ch}$ can be large (but creates issues with dilution) as shown below:

$$C_2/C_3(C_3P_{ch}+\dot{m}_{vs})-\dot{m}_{wc}/S_{eff}>>0 \text{ where } S_{eff}=SC_4/S+C_4.$$

During wafer processing, pressures in the reactor cavity and main chamber are modulated whereas the seal gas flow rate is kept constant. If the reactor cavity pressure is maintained ±1 Torr in relation to main chamber pressure, it is possible to contain the precursor gases within the reactor cavity. With the virtual gas seal arrangement, it is possible to maintain desired pressure in the reactor cavity with the inert gas seal.

Figure 10:
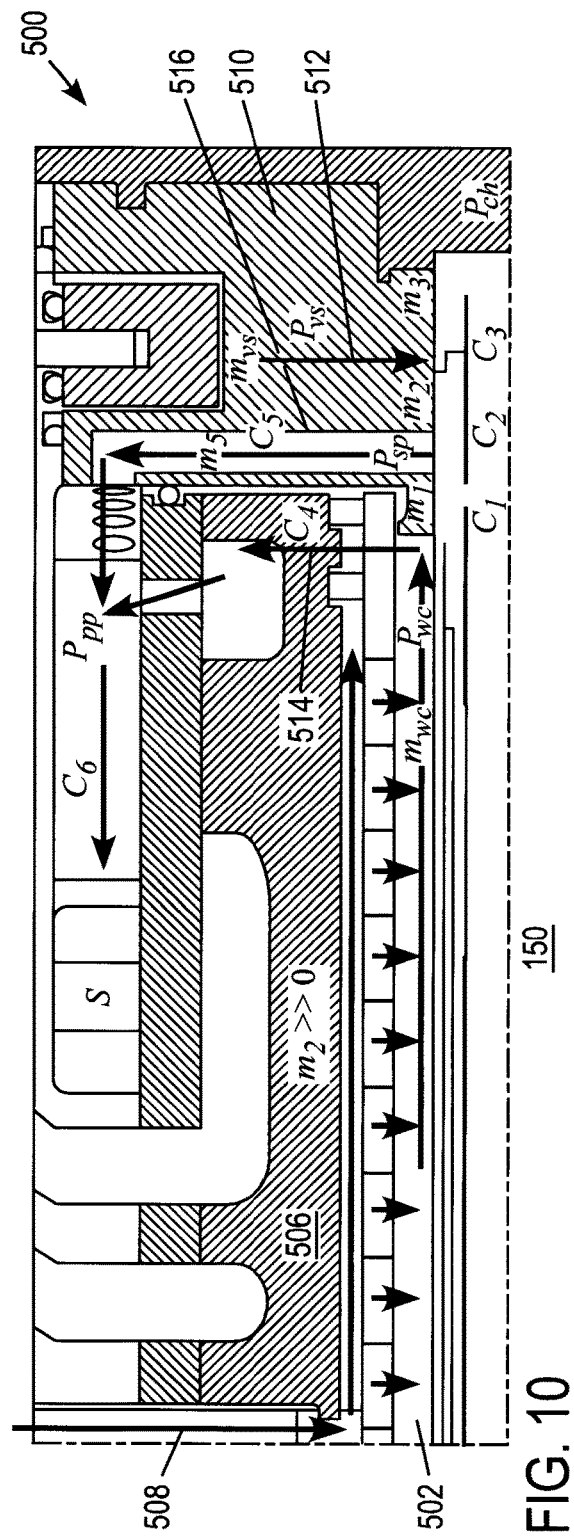
FIG. 10 illustrates gas flow in a showerhead module having a gas seal arrangement, main exhaust gas outlets around the periphery of the faceplate and secondary exhaust gas outlets outwardly of the main exhaust gas outlets and inwardly of the seal gas inlets.

FIG. 10 illustrates an embodiment wherein a showerhead module 500 includes a faceplate 502 having gas outlets 504, a backing plate 506 having a central gas passage 508, and an isolation ring 510 having seal gas passages 512 distributed circumferentially around the reaction cavity so as to provide an inert gas seal with gas supplied through gas passages 512. Process gas is withdrawn via main exhaust gas passages 514 distributed circumferentially around an outer portion of the faceplate 502 and secondary exhaust gas passages distributed circumferentially around the isolation ring 510 at a location between the gas passages 512 and the main exhaust passages 514. The secondary exhaust passages 516 remove gas through flow paths represented by flow conductances $C_5$ and $C_6$, and the secondary exhaust gas path $C_5$ can provide a further increase in Peclet number according to the following equation:

$$C_2/C_3(C_3P_{ch}+\dot{m}_{vs})+\dot{m}_{wc}(C_1C_4+C_4C_5/C_1C_5+C_1C_4+C_4C_5)\gg 0 \text{ where } S_{\mathit{eff}}=SC_6/S+C_6.$$

Figure 11:
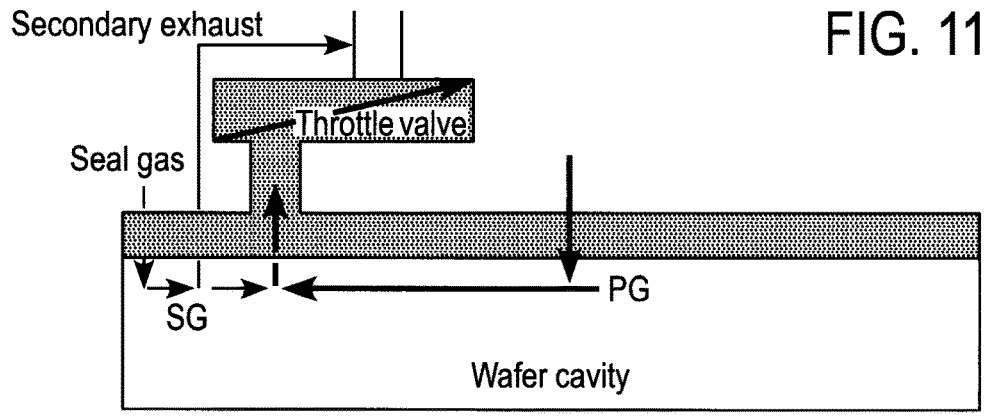
FIG. 11 illustrates gas flow for a showerhead module having main exhaust gas outlets and secondary exhaust gas outlets.

As shown in FIG. 10, the seal gas is injected out of passages 512 into a small gap between the pedestal module (not shown) and showerhead module 500 at location $P_{vs}$, the seal gas flows radially inward along path $C_2$ and radially outward along path $C_3$. The reacted precursor gases and inwardly flowing seal gas are pumped out of the reactor cavity 150 through the primary exhaust path located at $C_4$. In addition, some seal gas is pumped out through the secondary exhaust path (exhaust passages 516) at $C_5$. The mass flow rates of the seal gas are shown by $\dot{m}_{vs}$ (seal gas flowing into the narrow gap), $\dot{m}_2$ (seal gas flowing radially inward towards the reactor cavity 150), $\dot{m}_3$ (seal gas flowing radially outward and removed by vacuum pressure $P_{ch}$ of the vacuum source connected to the main chamber), $\dot{m}_1$ (seal gas flowing radially inward of the secondary exhaust outlets), and $\dot{m}_4$ (seal gas and process gases pumped out of the primary exhaust outlets). By keeping $C_5$ constant and high, the Peclet number can be made higher than a single-stage virtual gas seal. The secondary exhaust gas passages (secondary exhaust) are located between the seal gas entry point and the reactor cavity in order to provide the condition of making $S_{\mathit{eff}}$ and $C_5$ large. The secondary exhaust path is preferably connected downstream of a pressure control throttle valve to ensure constant exhaust and to provide the condition that $C_5$ be constant. FIG. 11 illustrates how process gases PG flow radially outward, seal gas SG flows radially inward, a portion of the seal gas SG flows out the secondary exhaust gas passages and a portion of the inert sealing gas and process gas flows out the main exhaust gas passages.

Figure 12:
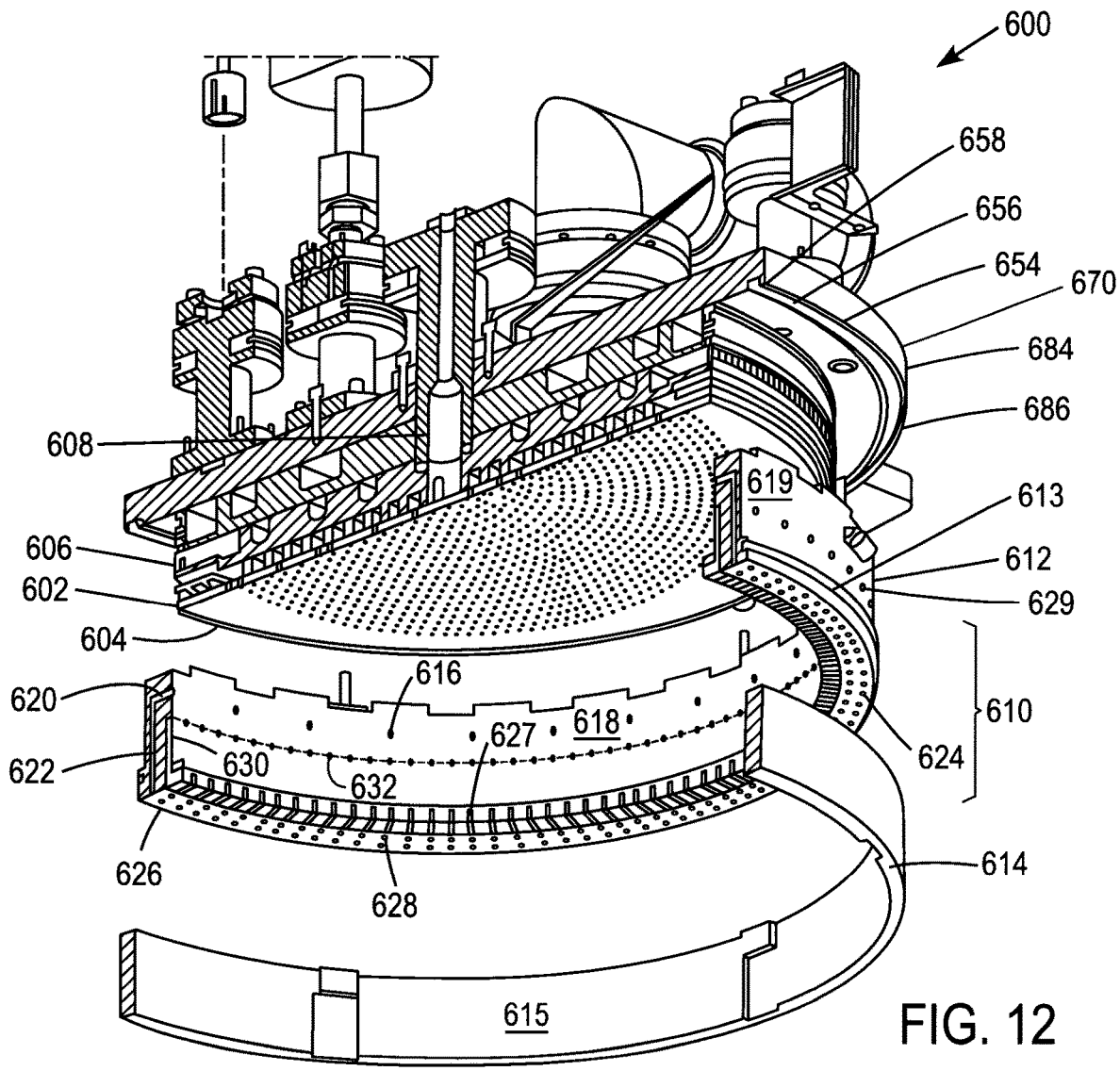
FIG. 12 illustrates a showerhead module having a two-piece isolation ring with seal gas outlets in a lower surface of an inner ring and secondary exhaust gas outlets in an inner surface of the inner ring.

FIG. 12 illustrates a cut-away view of a showerhead module 600 which includes a faceplate 602 having gas inlets 604, a backing plate 606 having a central gas passage 608, an isolation ring 610 having an inner ring 612 and outer ring 614. The inner ring 612 and outer ring 614 fit together such that a seal 613 around a lower portion of the inner ring 612 provides an annular plenum between opposed surfaces of the inner and outer rings. The inner ring 612 includes seal gas inlets 616 distributed circumferentially around an upper part of an inner surface 618, horizontal passages 620 extending radially outward from the inlets 616, vertical passages 622 extending downwardly from the horizontal passages 620 and seal gas outlets 624 distributed circumferentially around a lower surface 626 of the inner ring 612.

The inner ring 612 includes primary exhaust outlets 627 comprising radially extending slots distributed circumferentially around a lower portion of the inner surface 618 and secondary exhaust outlets 628 distributed circumferentially around the lower surface 626. The primary exhaust gas outlets 627 are connected to vertical passages 630 extending upward from the primary exhaust gas outlets 627 and inwardly extending horizontal passages having primary exhaust gas outlets 632 distributed circumferentially around the inner surface 618 at a location below the seal gas inlets 616. The secondary exhaust gas outlets 628 are connected to vertical passages (not shown) and horizontal passages having secondary exhaust gas outlets 629 distributed circumferentially around an outer surface 619 of the inner ring 612. The seal gas outlets 624 deliver seal gas to create a gas seal below the isolation ring 610 and some of the seal gas is withdrawn through the secondary exhaust gas outlets 628 during semiconductor substrate processing in the wafer cavity 150.

Figure 13:
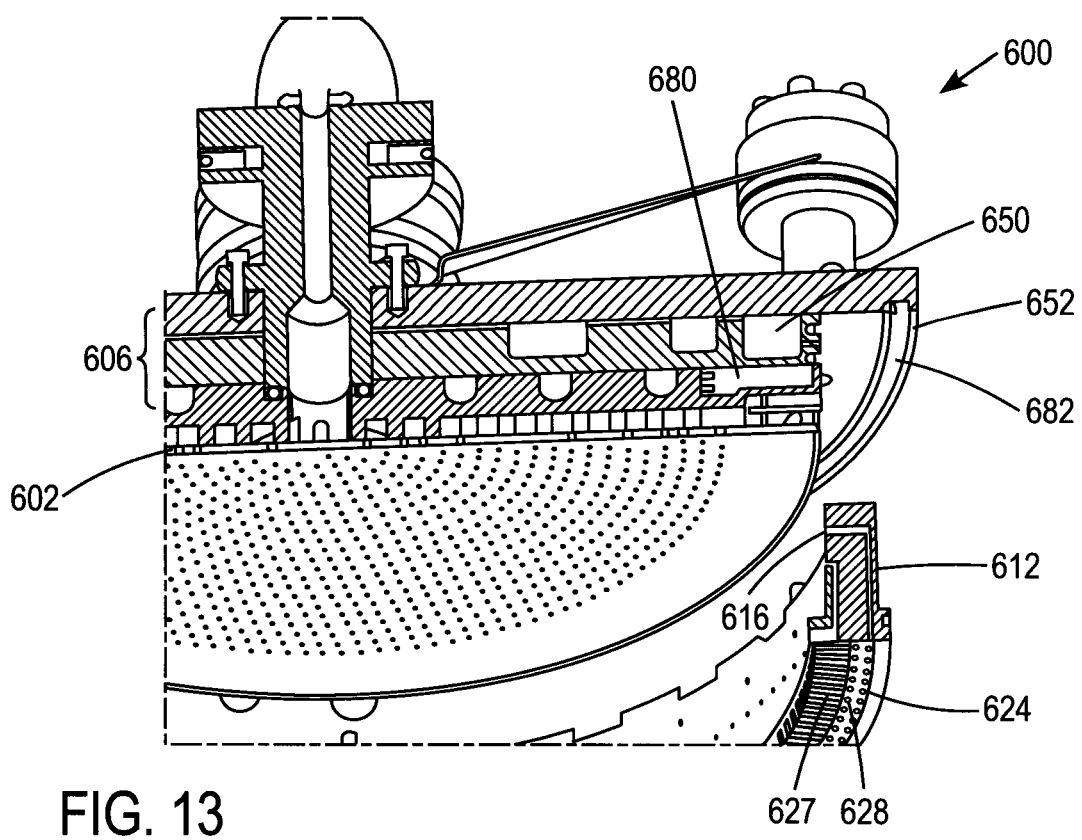
FIG. 13 shows how the inner ring fits around the faceplate and backing plate of a showerhead module.

FIG. 13 illustrates how inner ring 612 fits around an outer periphery of the faceplate 602 and backing plate (gas distribution plate or GDP) 606 such that seal gas can be supplied from seal gas supply plenum 650 in an outer portion of the GDP 606 to radially extending seal gas passages 652. The seal gas passages 652 open into an annular plenum 658 located between upper and lower gas seals 654, 656. The annular plenum 658 is in fluid communication with the seal gas inlets 616 in the inner surface 618 of the inner ring 612 to deliver seal gas through the seal gas outlets 624 in the lower surface 626 of the inner ring 612.

The GDP 606 includes a primary exhaust gas plenum 680 connected to radially extending primary exhaust outlets 682 in an outer periphery of the GDP 606. The outlets 682 open into an annular exhaust plenum 684 between the lower seal 656 and an annular seal 686. The annular exhaust plenum 684 communicates with the primary exhaust gas outlets 632 on the inner surface 618 of the inner ring 612. The primary exhaust gas outlets 632 connect with the vertical passages 630 and the slots 627 to allow primary gas to be exhausted from the wafer cavity 150.

The outer ring 614 surrounds the inner ring 612 with a plenum between the outer surface 619 of the inner ring 612 and an inner surface 615 of the outer ring 614. The secondary exhaust outlets 628 provide for secondary exhaust gas to be withdrawn through the secondary exhaust gas outlets 629 into the plenum between the inner ring 612 and the outer ring 614. The GDP includes at least one opening 670 in an upper surface to allow the secondary exhaust gas to be withdrawn while bypassing the throttle vale pumping arrangement connected to the primary exhaust gas plenum 680. Preferably, two opposed openings 670 are provided in the GDP for azimuthal uniformity of gas flow.

Figure 14:
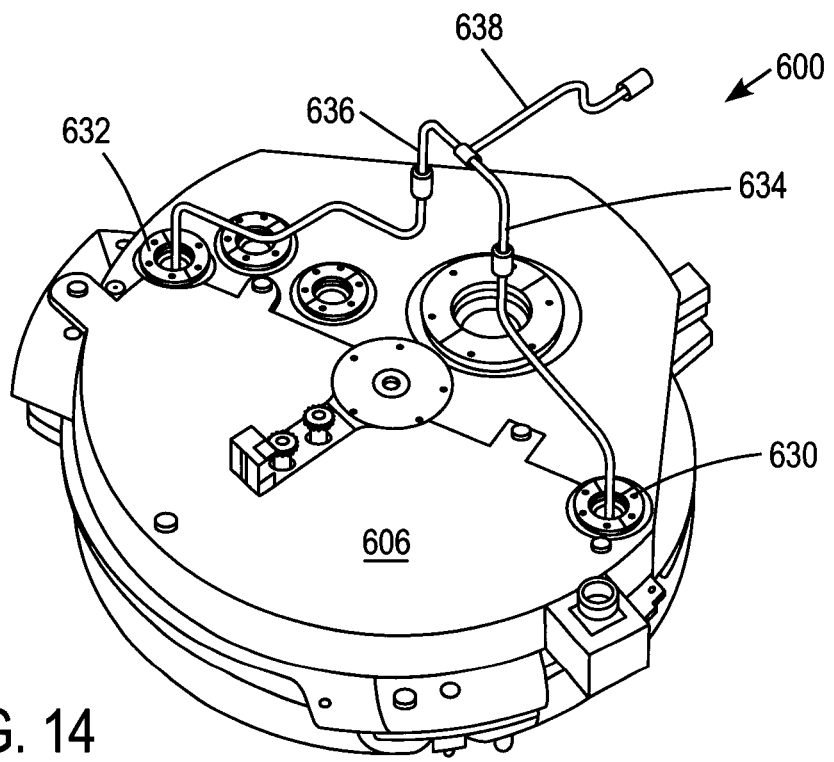
FIG. 14 shows gas connections which connect to the secondary exhaust passages in a top plate of the showerhead module.

FIG. 14 illustrates two gas seal connections 630, 632 on the upper surface of the GDP 606 connected to the two openings 670 for secondary exhaust gas removal. The gas connections 630, 632 are attached to two respective tubing sections 634, 636 which are connected to a single tube 638 in fluid communication to an exhaust pump thereby bypassing the throttle valve connected to the primary exhaust outlets. Thus, a portion of the seal gs creating the gas seal can be withdrawn independently of the primary exhaust gas.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features, which meet the strict definitions, but also features, which fairly approximate the strict definitions.

While the plasma processing apparatus including an isothermal deposition chamber has been described in detail with reference to specific embodiments thereof, it will be apparent to those skilled in the art that various changes and modifications can be made, and equivalents employed, without departing from the scope of the appended claims.

What is claimed is:

1. A chemical deposition chamber having a gas seal, the chemical deposition chamber comprising:

a showerhead module and a pedestal module, the pedestal module configured to support a semiconductor substrate in a substrate cavity located beneath a faceplate of the showerhead module;

gas inlets in the faceplate configured to deliver process gas to the substrate cavity;

primary exhaust gas outlets in the faceplate configured to remove reaction gas chemistries and inert gases from the substrate cavity;

an annular step at an outer periphery of the substrate cavity, the annular step formed projecting downward toward the substrate cavity;

an inert gas feed configured to deliver an inert seal gas to form a gas seal in a gap between the annular step and the pedestal module, the gas seal to establish a substantial equilibrium between the process gases and the inert seal gas, the gap being formed when the pedestal module is moved proximate to the showerhead module;

secondary exhaust gas outlets located radially outward of the primary exhaust gas outlets, the secondary exhaust gas outlets configured to remove at least some of the inert gas that has flowed radially inward through the gap; and an isolation ring surrounding the faceplate, the annular step comprising a lower portion of the isolation ring, the isolation ring including inert gas feed inlets in an inner surface of the isolation ring and inert gas feed passages extending radially outward from the inert gas feed inlets, the inert gas feed passages further extending vertically downward to the lower surface of the annular step.

2. The chemical deposition chamber of claim 1, wherein the gas inlets are located in an inner portion of the faceplate and the primary exhaust gas outlets are located in an outer portion of the faceplate.

3. The chemical deposition chamber of claim 1, wherein the primary exhaust gas outlets and the secondary exhaust gas outlets are located in a lower surface of the annular step.

4. The chemical deposition chamber of claim 1, wherein the primary exhaust gas outlets are in fluid communication with a pressure control throttle valve connected to a source of vacuum pressure.

5. The chemical deposition chamber of claim 4, wherein the secondary exhaust gas outlets are in fluid communication with a source of vacuum pressure which is constant.

6. The chemical deposition chamber of claim 1, wherein the gap has a width of about 5.0 mm to 25.0 mm from an outer edge of the wafer cavity to an outer edge of the step.

7. The chemical deposition chamber of claim 1, wherein the primary exhaust gas outlets are in an isolation ring surrounding the faceplate, the isolation ring including primary exhaust gas passages communicating with an annular plenum between the isolation ring and an outer periphery of a backing plate of the showerhead module.

8. The chemical deposition chamber of claim 1, wherein the secondary exhaust gas outlets are in an isolation ring surrounding the faceplate, the isolation ring including inner and outer rings, the secondary exhaust gas passages communicating with an annular plenum between an outer surface of the inner ring and an inner surface of the outer ring.

9. The chemical deposition chamber of claim 1, wherein the inert gas feed comprises an annular plenum in a backing plate of the showerhead module, the backing plate including seal gas passages extending radially outward from the annular plenum and in fluid communication with seal gas outlets on an outer periphery of the backing plate.

10. The chemical deposition chamber of claim 1, wherein the pedestal module is movable vertically upward to place the semiconductor substrate in the wafer cavity and movable downwardly to a position for loading and unloading the semiconductor substrate onto the substrate pedestal.

11. The chemical deposition chamber of claim 10, wherein at least one exhaust passage is located in the pedestal module, the at least one exhaust passage located radially outward of the wafer cavity and configured to remove at least some of the inert gas fed into the gap.

12. The chemical deposition chamber of claim 11, wherein the at least one exhaust passage comprises an annular channel.

13. The chemical deposition chamber of claim 1, wherein the primary exhaust gas outlets are located in a lower portion of the inner surface of the isolation ring, primary exhaust gas passages extend upward from the primary exhaust gas outlets, and the primary exhaust gas passages extend horizontally to openings in the inner surface at a location below the inert gas feed inlets; and the secondary exhaust gas outlets are located in a lower surface of the isolation ring, secondary exhaust gas passages extend upward from the secondary exhaust gas outlets to openings in an outer surface of the isolation ring.

14. A gas seal apparatus, comprising:

an annular step at an outer periphery of a substrate cavity located between a gas-distribution showerhead and a substrate pedestal, the annular step formed projecting downward toward the substrate cavity;

an inert gas feed configured to deliver an inert seal gas to form a gas seal in a gap between the annular step and the pedestal module, the gas seal to establish a substantial equilibrium between process gases and the inert seal gas, the gap being formed when the pedestal module is moved proximate to the gas-distribution showerhead; and an annular evacuation passage located radially outward of the annular step: and an isolation ring surrounding the faceplate, the annular step comprising a lower portion of the isolation ring, the isolation ring including inert gas feed inlets in an inner surface of the isolation ring and inert gas feed passages extending radially outward from the inert gas feed inlets, the inert gas feed passages further extending vertically downward to the lower surface of the annular sten.

* * * * *

UNITED STATES PATENT AND TRADEMARK OFFICE
CERTIFICATE OF CORRECTION

PATENT NO. : 10,781,516 B2  
APPLICATION NO. : 15/385089  
DATED : September 22, 2020  
INVENTOR(S) : Chandrasekharan et al.

Page 1 of 1

It is certified that error appears in the above-identified patent and that said Letters Patent is hereby corrected as shown below:

On the Title Page

In item (72), in "Inventors", in Column 1, Line 3, delete "Mountainview," and insert --Mountain View,-- therefor In the Specification In Column 12, Line 57, delete "gs" and insert --gas-- therefor In the Claims In Column 14, Line 51, in Claim 14, delete "step: and" and insert --step; and-- therefor In Column 14, Line 58, in Claim 14, delete "sten." and insert --step.-- therefor Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*